United States Patent
Fukui et al.

(10) Patent No.: US 9,184,354 B2
(45) Date of Patent: Nov. 10, 2015

(54) LIGHT-EMITTING DEVICE

(71) Applicant: TOYODA GOSEI CO., LTD., Kiyosu-shi (JP)

(72) Inventors: Kosei Fukui, Kiyosu (JP); Toshimasa Hayashi, Kiyosu (JP); Takashi Nonogawa, Kiyosu (JP); Takashi Terayama, Kiyosu (JP); Satoshi Wada, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 14/168,991

(22) Filed: Jan. 30, 2014

(65) Prior Publication Data

US 2014/0231821 A1  Aug. 21, 2014

(30) Foreign Application Priority Data

Feb. 20, 2013 (JP) .................... 2013-031128
Dec. 10, 2013 (JP) .................... 2013-254993

(51) Int. Cl.
*H01L 33/08* (2010.01)
*H01L 33/52* (2010.01)
*H01L 25/075* (2006.01)
*H01L 33/16* (2010.01)

(52) U.S. Cl.
CPC ............ *H01L 33/52* (2013.01); *H01L 25/0753* (2013.01); *H01L 33/16* (2013.01); *H01L 2924/0002* (2013.01)

(58) Field of Classification Search
CPC ........................................ H01L 33/08
USPC ........................................ 257/76, 88
See application file for complete search history.

(56) References Cited

U.S. PATENT DOCUMENTS

| | | | |
|---|---|---|---|
| 2003/0152338 A1* | 8/2003 | Kuhara et al. | 385/89 |
| 2006/0055309 A1 | 3/2006 | Ono et al. | |
| 2006/0092532 A1* | 5/2006 | Ouderkirk et al. | 359/819 |
| 2008/0298063 A1 | 12/2008 | Hayashi | |
| 2009/0256166 A1* | 10/2009 | Koike et al. | 257/98 |
| 2010/0264449 A1 | 10/2010 | Hayashi | |
| 2011/0079795 A1* | 4/2011 | Nagai | 257/77 |
| 2011/0111082 A1 | 5/2011 | Hayashi | |
| 2012/0187412 A1* | 7/2012 | D'Evelyn et al. | 257/76 |
| 2013/0217162 A1* | 8/2013 | Han et al. | 438/33 |

FOREIGN PATENT DOCUMENTS

JP  2006-86191 A  3/2006
JP  2008-300694 A  12/2008

* cited by examiner

*Primary Examiner* — Edward Wojciechowicz
(74) *Attorney, Agent, or Firm* — McGinn IP Law Group, PLLC.

(57) ABSTRACT

A light-emitting device includes a plurality of LED chips arranged in series and each including a chip substrate and a crystal layer including a light-emitting layer. One of the plurality of LED chips is configured such that the chip substrate thereof includes a side surface facing another adjacent LED chip of the plurality of LED chips. The side surface has a highest cleavability among all side surfaces of the chip substrate of the one of the plurality of LED chips.

20 Claims, 6 Drawing Sheets

LIGHT-EMITTING DEVICE

The present application is based on Japanese patent application Nos. 2013-031128 and 2013-254993 filed on Feb. 20, 2013 and Dec. 10, 2013, respectively, the entire contents of which are incorporated herein by reference.

BACKGROUND OF THE INVENTION

1. Field of the Invention

The invention relates to a light-emitting device.

2. Related Art

A light-emitting device is known that a light-shielding film is formed on side surfaces of an LED chip (See, e.g., JP-A-2006-086191). The light-shielding film is formed by laminating e.g., $SiO_2$ film and aluminum film so as to substantially eliminate light emitted through the side surfaces of the LED chip.

SUMMARY OF THE INVENTION

It is an object of the invention to provide a light-emitting device that has plural LED chips and is excellent in light extraction efficiency.

(1) According to one embodiment of the invention, a light-emitting device comprises:

a plurality of LED chips arranged in series and each comprising a chip substrate and a crystal layer including a light-emitting layer, wherein one of the plurality of LED chips is configured such that the chip substrate thereof comprises a side surface facing another adjacent LED chip of the plurality of LED chips, and wherein the side surface has a highest cleavability among all side surfaces of the chip substrate of the one of the plurality of LED chips.

In the above embodiment (1) of the invention, the following modifications and changes can be made.

(i) The chip substrate comprises a hexagonal crystal, and wherein the side surface having the highest cleavability comprises an m-plane.

(ii) The chip substrate is rectangular in plain view, and wherein four side surfaces of the chip substrate comprise an m-plane or an a-plane.

(iii) The chip substrate comprises GaN.

(iv) The chip substrate comprises a GaN based semiconductor crystal, and
wherein the side surface having the highest cleavability comprises a c-plane.

(v) The chip substrate is rectangular in plain view, and wherein four side surfaces of the chip substrate comprise a c-plane and an a-plane.

(vi) The plurality of LED chips are formed by dividing a wafer so as to use a cleavability of the wafer.

(2) According to another embodiment of the invention, a light-emitting device comprises:

a plurality of LED chips arranged in series or in an array pattern; and a sealing resin for sealing the plurality of LED chips, wherein one of the plurality of LED chips comprises a low refractive index-member formed on a side surface thereof facing another adjacent LED chip of the plurality of LED chips, and wherein the low refractive index-member has a lower refractive index than the sealing member.

In the above embodiment (2) of the invention, the following modifications and changes can be made.

(vii) The low refractive index-member comprises a silicone-based resin, a fluorine-based resin, a siloxane-based resin, glass, SiO2 or a mixture of two or more thereof.

EFFECTS OF THE INVENTION

According to one embodiment of the invention, a light-emitting device can be provided that has plural LED chips and is excellent in light extraction efficiency.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment

Figure 1A:
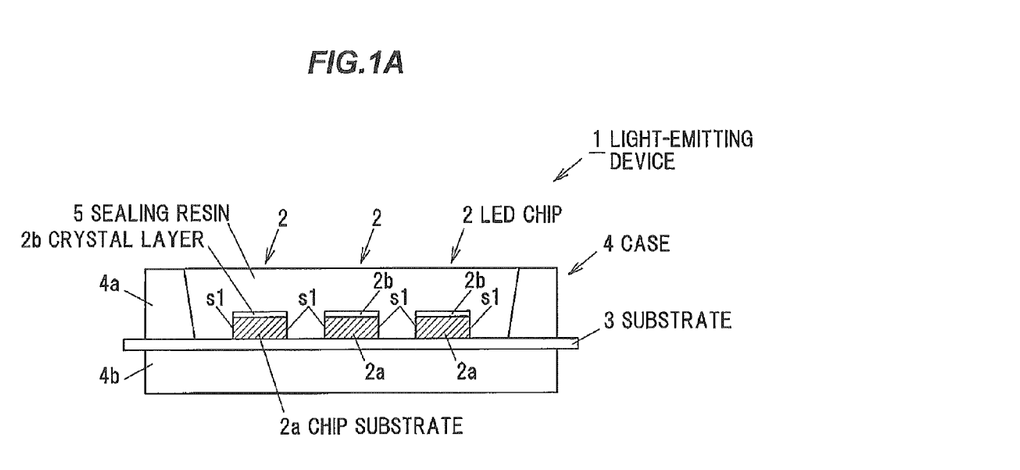
FIG. 1A and FIG. 1B are respectively a vertical cross-sectional view and a top view showing a light-emitting device in a first embodiment.
Figure 1B:
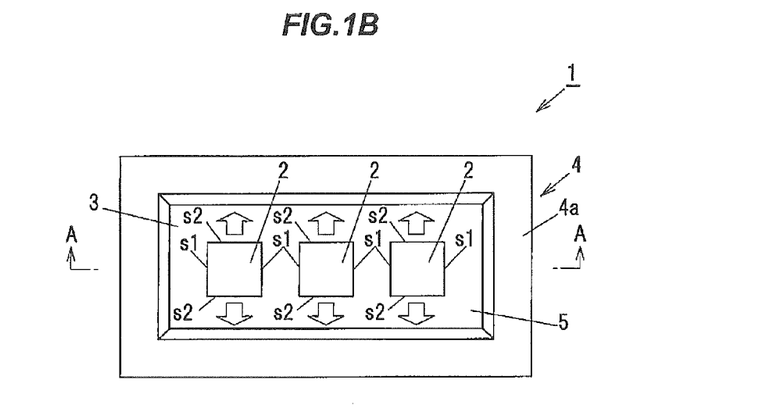

FIG. 1A and FIG. 1B are respectively a vertical cross-sectional view and a top view showing a light-emitting device 1 in the first embodiment. The cross section in FIG. 1A is taken along line A-A in FIG. 1B.

The light-emitting device 1 has a case 4, a substrate 3 included in the case 4, plural LED chips 2 arranged in series (in a line) in the case 4 and a sealing resin 5 for sealing the LED chips 2 in the case 4.

The LED chip 2 includes a chip substrate 2a and a crystal layer 2b which has a non-illustrated light-emitting layer. The chip substrate 2a is, e.g., an insulating substrate such as sapphire substrate or a conductive substrate such as GaN substrate. The crystal layer 2b is, e.g., a GaN-based semiconductor layer formed on the chip substrate 2a by epitaxial crystal growth and has a light-emitting layer sandwiched between an n-type semiconductor layer and a p-type semiconductor layer.

The LED chip 2 may be a face-up LED chip with the crystal layer 2b facing upward or a face-down LED chip with the crystal layer 2b facing downward.

The LED chip 2 is rectangular in plain view, and two facing side surfaces of the chip substrate 2a have the same plane orientation. Here, of two pairs of facing side surfaces of the chip substrate 2a, two facing side surfaces having a high cleavability are defined as S1 and other two facing side surfaces having a low cleavability are defined as S2.

In the chip substrate 2a of any of the plural LED chips 2, a side surface(s) facing another adjacent LED chip(s) 2 is a surface having the highest cleavability among all side surfaces. In other words, the plural LED chips 2 are arranged so that, in any LED chip 2, the side surface(s) S1 having the highest cleavability among all side surfaces (the side surfaces S1 and the side surfaces S2) of the chip substrate 2a faces another adjacent LED chip(s) 2.

When the chip substrate 2a is cut on the surface having a high cleavability at the time of dicing a wafer to divide into plural LED chips 2, the surface of section is smooth. Therefore, the side surface S1 has higher smoothness than the side surface S2 and light is likely to be totally reflected thereon. The light reflected on the side surface S1 is emitted through e.g. an upper surface of the LED chip 2 or the side surfaces S2.

On the other hand, the side surface S2 has low smoothness and high roughness (i.e., many concavity and convexity) and light is likely to penetrate therethrough. In other words, the light emitted from the light-emitting layer of the crystal layer 2b and incident on the chip substrate 2a is more likely to be emitted through the side surface S2 than the side surface S1. Hollow arrows in FIG. 1B schematically show directions in which the amount of light emitted is large.

In general, light emitted from a surface facing another adjacent LED chip is incident on and may be absorbed by the adjacent LED chip. In the light-emitting device 1, since light is less likely to be emitted from the side surfaces S1 which face other adjacent LED chips 2, it is possible to reduce light loss due to absorption by the other adjacent LED chips 2 and thereby to improve light extraction efficiency of the light-emitting device 1.

The present embodiment is to use the difference in smoothness caused by the difference in cleavability between side surfaces of the chip substrate 2a and it is thus effective especially when the wafer is divided into the LED chips 2 by a method in which cleavability has a strong effect on smoothness of the section, i.e., by a dividing method using the cleavability of the wafer. It is more effective in the case where the wafer is cleaved and divided by applying an external force than the case where the wafer is cut and divided by a dicing blade.

The side surfaces S1 and S2 in case of using a GaN substrate or a sapphire substrate as the chip substrate 2a will be described below as an example. The GaN substrate and the sapphire substrate are with a hexagonal crystal system and have m-planes, i.e., {10-10} planes and a-planes, i.e., {11-20} planes. The m-plane is orthogonal to the a-plane and the m-plane of the GaN substrate and the sapphire substrate has higher cleavability than the a-plane. Therefore, when the chip substrate 2a is the GaN substrate or the sapphire substrate, the chip substrate 2a can have the side surface S1 as the m-plane and the side surface S2 as the a-plane. Meanwhile, the principal surface (i.e., the upper surface and lower surface) of the chip substrate 2a which has the side surface S1 as the m-plane and the side surface S2 as the a-plane is a c-plane, i.e., a {0001} plane.

The GaN substrate is more likely to absorb light than the sapphire substrate. In this regard, the present embodiment to reduce the light outputted from one LED chip 2 to the adjacent LED chip 2 is especially advantageous to the case where the GaN substrate is used as the chip substrate 2a.

The case 4 has a bottom 4b and an annular sidewall 4a. The plural LED chips 2 are mounted in a region surrounded by the sidewall 4a.

The case 4 is formed of, e.g., a thermoplastic resin such as polyphthalamide resin, LCP (Liquid Crystal Polymer) or PCT (Polycyclohexylene Dimethylene Terephthalate) or a thermosetting resin such as silicone resin, modified silicone resin, epoxy resin or modified epoxy resin. The case 4 may contain light-reflecting particles of titanium dioxide, etc., to improve light reflectance.

The substrate 3 is, e.g., a lead frame with the entirety or a surface formed of a conductive material such as Ag, Cu or Al, or a substrate having a conductive pattern on a surface thereof. The LED chip 2 and the substrate 3 are electrically connected by non-illustrated wires or bumps, etc.

The sealing resin 5 is formed of, e.g., a resin material such as silicone-based resin, epoxy-based resin, triazine-based resin or acrylic-based resin, etc., or glass. In addition, the sealing resin 5 may contain phosphor particles. For example, when emission color of the LED chip 2 is blue and fluorescence color of the phosphor contained in the sealing resin 5 is yellow, emission color of the light-emitting device 1 is white.

Second Embodiment

The second embodiment is different from the first embodiment in a means of reducing light which is emitted from one LED chip toward another adjacent LED chip.

Figure 2A:
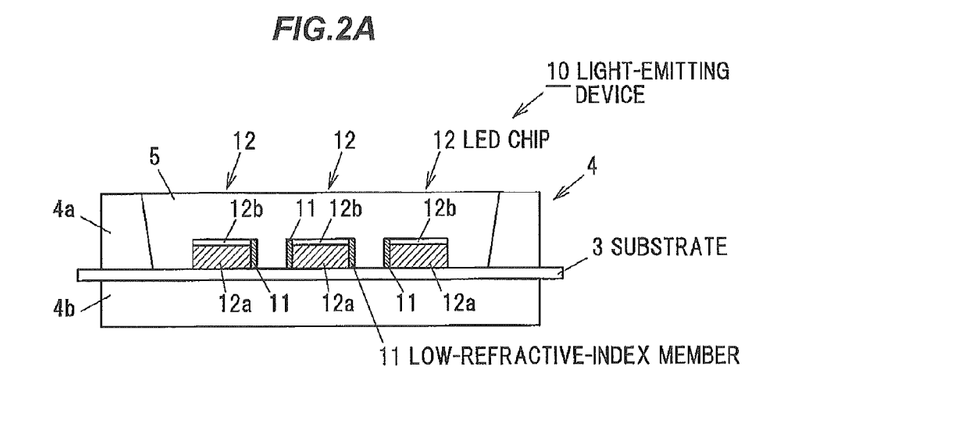
FIG. 2A and FIG. 2B are respectively a vertical cross-sectional view and a top view showing a light-emitting device in a second embodiment.
Figure 2B:
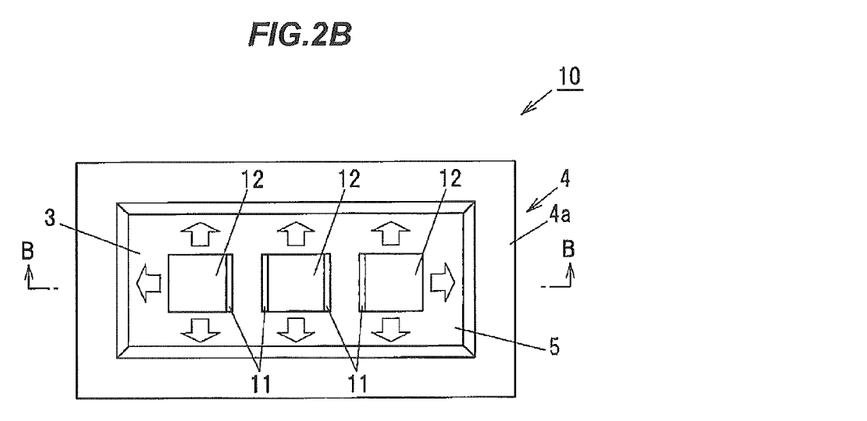

FIG. 2A and FIG. 2B are respectively a vertical cross-sectional view and a top view showing a light-emitting device 10 in the second embodiment. The cross section in FIG. 2A is taken along line B-B in FIG. 2B.

The light-emitting device 10 has the case 4, the substrate 3 included in the case 4, plural LED chips 12 arranged in series in the case 4 and the sealing resin 5 for sealing the LED chips 12 in the case 4.

The LED chip 12 includes a chip substrate 12a and a crystal layer 12b which has a light-emitting layer (not shown). The chip substrate 12a and the crystal layer 12b respectively have the same structures as the chip substrate 2a and the crystal layer 2b in the first embodiment.

The LED chip 12 may be a face-up LED chip with the crystal layer 12b facing upward or a face-down LED chip with the crystal layer 12b facing downward.

The shape of the LED chip 12 is not limited and is, e.g., rectangular in plain view. Unlike the chip substrate 2a in the first embodiment, properties of side surfaces of the chip substrate 12a are not limited.

A low refractive index-member 11 having a lower refractive index than the sealing resin 5 is provided such that the low refractive index-member 11 in any of the plural LED chips 12 is formed on a side surface(s) facing another adjacent LED chips 12.

Since the low refractive index-member 11 has a lower refractive index than the sealing resin 5, a critical angle of total reflection at an interface between the LED chip 12 and the low refractive index-member 11 is smaller than that at an interface between the LED chip 12 and the sealing resin 5. Therefore, by providing the low refractive index-member 11 on a side surface of the LED chip 12, light travelling from the inside toward outside of the LED chip 12 becomes more likely to be totally reflected at such a side surface and less likely to be emitted to the outside. The light reflected at the interface between the LED chip 12 and the low refractive index-member 11 is emitted from the LED chip 12 through, e.g., an upper surface or a side surface(s) on which the low refractive index-member 11 is not formed.

In the light-emitting device 10, since the low refractive index-member 11 is provided on the side surface(s) facing another adjacent LED chip(s) 12 and light is thus less likely to be emitted therethrough, it is possible to reduce light absorption by the other adjacent LED chip(s) 12 and thereby to improve light extraction efficiency of the light-emitting device 10. Hollow arrows in FIG. 2B schematically show directions in which the amount of light emitted is large.

The low refractive index-member 11 is formed of silicone-based resin, a fluorine-based resin, a siloxane-based resin, glass (formed by a sol-gel method), $SiO_2$ (formed by a vapor deposition method, a sputtering method or a CVD method) or a mixture of two or more thereof, etc. Among the above-listed materials, a material having a lower refractive index than the material of the sealing resin 5 is selected and used.

The GaN substrate is more likely to absorb light than the sapphire substrate. In this regard, the present embodiment to reduce the light outputted from one LED chip 12 to the adjacent LED chip 12 is especially advantageous to the case where the GaN substrate is used as the chip substrate 12a.

Figure 3:
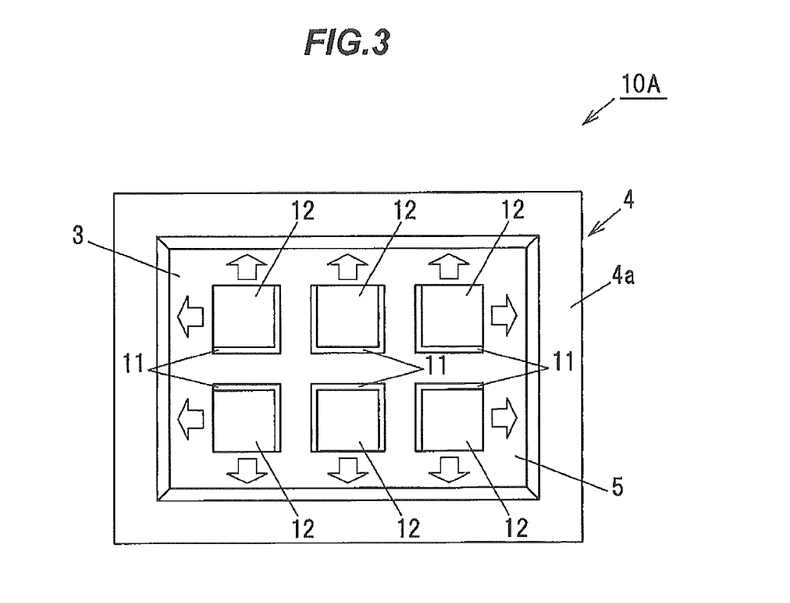
FIG. 3 is a top view showing a modification of the light-emitting device in the second embodiment.

FIG. 3 is a top view showing a light-emitting device 10A as a modification of the light-emitting device 10 in the second embodiment. In the light-emitting device 10A, the LED chips 12 are arranged in an array pattern (lattice pattern).

Also in the light-emitting device 10A, the low refractive index-member 11 is provided such that the low refractive index-member 11 in any LED chip 12 is formed on side surfaces facing other adjacent LED chips 12, as shown in FIG. 3. Therefore, it is possible to reduce light absorption by the other adjacent LED chips 12 and thereby to improve light extraction efficiency of the light-emitting device 10A. Hollow arrows in FIG. 3 schematically show directions in which the amount of light emitted is large.

Figure 4A:
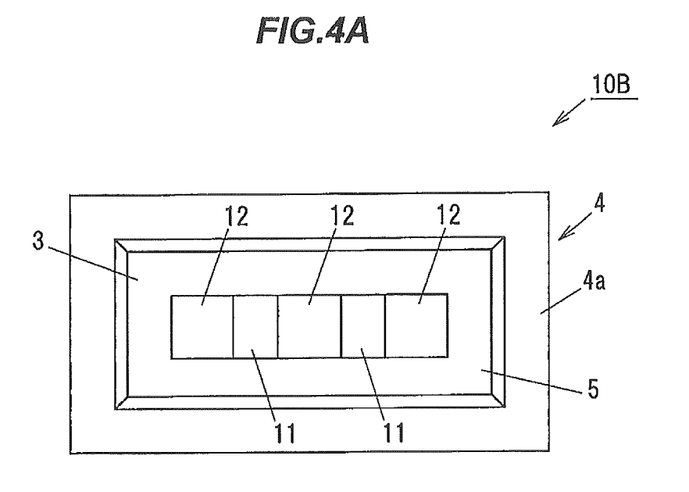
FIG. 4A and FIG. 4B are respectively top views showing modifications of the light-emitting device in the second embodiment.
Figure 4B:
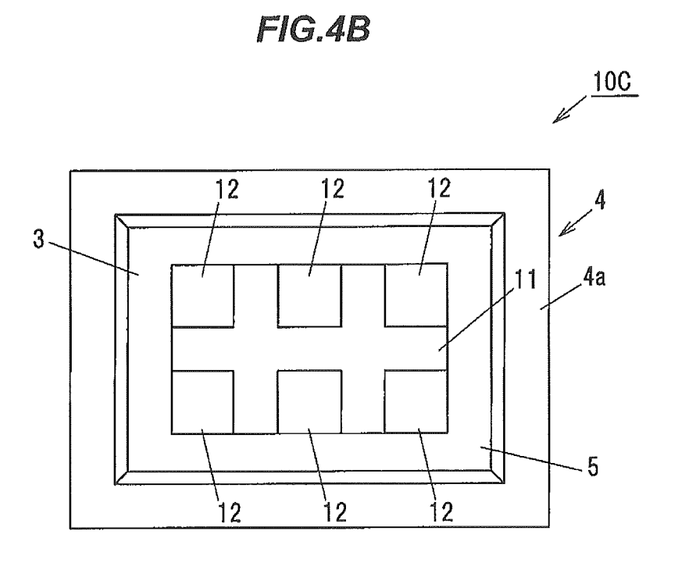

FIG. 4A and FIG. 4B are respectively top views showing light-emitting devices 10B and 10C as modifications of the light-emitting device 10 in the second embodiment. In the light-emitting devices 10B and 10C, the low refractive index-member 11 is formed so as to fill gaps between adjacent LED chips 12.

The LED chips 12 are arranged in series in the light-emitting device 10B and are arranged in an array pattern in the light-emitting device 10C. In each case, the low refractive index-member 11 in any LED chip 12 is formed on a side surface(s) facing another adjacent LED chip(s) 12. Therefore, it is possible to reduce light absorption by the other adjacent LED chip(s) 12 and thereby to improve light extraction efficiency of the light-emitting devices 10B and 10C.

Figure 5A:
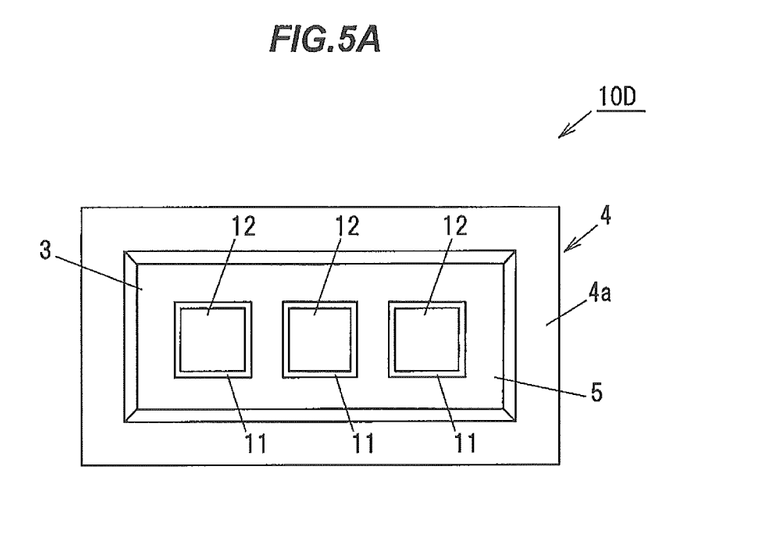
FIG. 5A and FIG. 5B are respectively top views showing modifications of the light-emitting device in the second embodiment.
Figure 5B:
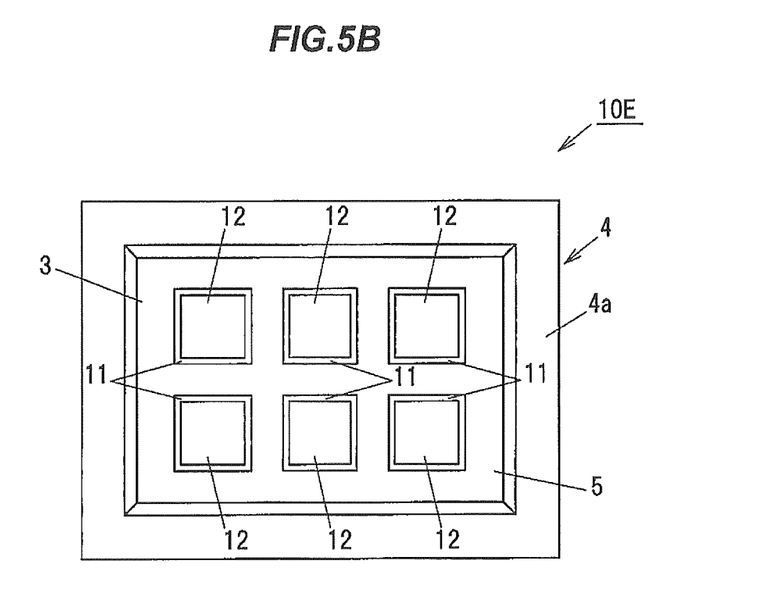

FIG. 5A and FIG. 5B are respectively top views showing light-emitting devices 10D and 10E as modifications of the light-emitting device 10 in the second embodiment. In the light-emitting devices 10B and 10C, the low refractive index-member 11 is formed on all side surfaces of each LED chip 12.

The LED chips 12 are arranged in series in the light-emitting device 10D and are arranged in an array pattern in the light-emitting device 10E. In each case, a side surface(s) facing another adjacent LED chip(s) 12 is covered with the low refractive index-member 11 in any LED chip 12. Therefore, it is possible to reduce light absorption by the other adjacent LED chip(s) 12 and thereby to improve light extraction efficiency of the light-emitting devices 10D and 10E.

Third Embodiment

The third embodiment is different from the first embodiment in terms of a crystal orientation of LED chip. The explanation for the same components or functions as in the first embodiment will be omitted or not detailed.

In the third embodiment, the chip substrate and crystal layers of an LED chip are formed of a GaN based semiconductor such as GaN. The plane orientation of the principal surface of the chip substrate and crystal layers is m-plane. This allows the light-emitting device of the third embodiment to avoid the problem that arises when the plane orientation of the principal surface of the chip substrate and crystal layers is c-plane. The problem will be detailed below.

If the crystal layers of a GaN based semiconductor crystal are grown in the c-plane orientation (i.e., if the principal surface is c-plane), a piezoelectric polarization occurs in the c-axis direction along the crystal growth direction due to the lattice strain of the GaN based semiconductor crystal. Thereby, a piezoelectric electric field is generated in the c-axis direction. Due to the piezoelectric electric field, electron and hole injected into a light-emitting layer of a GaN based semiconductor such as InGaN are separated so as to reduce the recombination contributing to the emission to lower the luminous efficiency. Also, the other problem (i.e., droop phenomenon) may be caused that the luminous efficiency lowers as the drive current density of an LED chip increases.

Figure 6A:
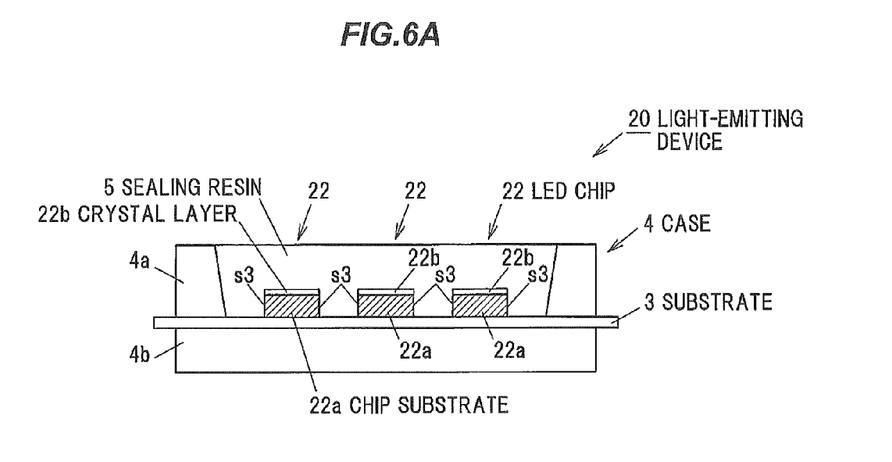
FIG. 6A and FIG. 6B are respectively a vertical cross-sectional view and a top view showing a light-emitting device in a third embodiment.
Figure 6B:
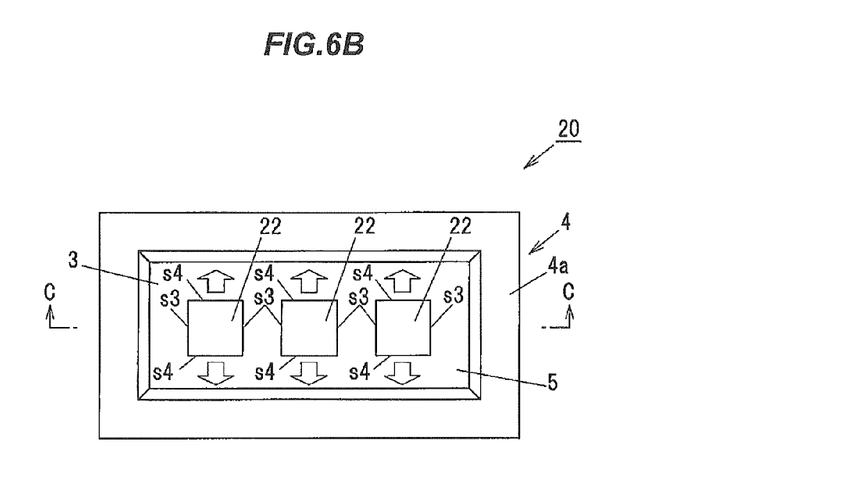

FIG. 6A and FIG. 6B are respectively a vertical cross-sectional view and a top view showing a light-emitting device 20 in the third embodiment. The cross section in FIG. 6A is taken along line C-C in FIG. 6B.

The light-emitting device 20 has the case 4, the substrate 3 included in the case 4, plural LED chips 22 arranged in series in the case 4 and the sealing resin 5 for sealing the LED chips 22 in the case 4.

The LED chip 22 includes a chip substrate 22a and a crystal layer 22b which has a light-emitting layer (not shown). The chip substrate 22a is a conductive substrate of a GaN based semiconductor crystal. The crystal layer 22b is a layer of a GaN based semiconductor crystal and epitaxially grown on the chip substrate 22a and includes a light-emitting layer sandwiched between a n-type semiconductor layer and a p-type semiconductor layer.

The LED chip 22 may be a face-up LED chip with the crystal layer 22b facing upward or a face-down LED chip with the crystal layer 22b facing downward.

The shape of the LED chip 22 is rectangular in plain view, and two facing side surfaces of the chip substrate 22a have the same plane orientation. Here, of two pairs of facing side surfaces of the chip substrate 22a, two facing side surfaces having a high cleavability are defined as S3 and other two facing side surfaces having a low cleavability are defined as S4.

In the chip substrate 22a of any of the plural LED chips 22, a side surface(s) facing another adjacent LED chip(s) 22 is a surface having the highest cleavability among all side surfaces. In other words, the plural LED chips 22 are arranged so that, in any LED chip 22, the side surface(s) S3 having the highest cleavability among all side surfaces (the side surfaces S3 and the side surfaces S4) of the chip substrate 22a faces another adjacent LED chip(s) 22.

When the chip substrate 22a is cut on the surface having a high cleavability at the time of dicing a wafer to divide into plural LED chips 22, the surface of section is smooth. Therefore, the side surface S3 has higher smoothness than the side surface S4 and light is likely to be totally reflected thereon. The light reflected on the side surface S3 is emitted through e.g., an upper surface of the LED chip 22 or the side surfaces S4.

On the other hand, the side surface S4 has low smoothness and high roughness (i.e., many concavity and convexity) and light is likely to penetrate therethrough. In other words, the light emitted through from the light-emitting layer of the crystal layer 22b and incident on the chip substrate 22a is more likely to be emitted through the side surface S4 than the side surface S3. Hollow arrows in FIG. 6B schematically show directions in which the amount of light emitted is large.

In the third embodiment, the side surface S3 is c-plane, the surface S4 is a-plane and the principal surface (i.e., the upper and lower surfaces) of the chip substrate 22a is m-plane. Since the principal surface of the chip substrate 22a is m-plane, the principal surface of the crystal layer 22b which is epitaxially grown on the chip substrate 22a is also m-plane. Therefore, the abovementioned problem that the lowering of the luminous efficiency or the droop phenomenon caused by the generation of the piezoelectric electric field when the principal surface of the crystal surface is c-plane can be prevented.

Effects of the Embodiments

In the above-mentioned embodiments, reducing light emitted from any LED chip toward another adjacent LED chip allows light loss due to light absorption between LED chips to be reduced and light extraction efficiency of the light-emitting device to be improved.

Although the embodiments of the invention have been described, the invention is not intended to be limited to the embodiments and the various kinds of modifications can be implemented without departing from the gist of the invention.

In addition, the constituent elements in the embodiments can be arbitrarily combined without departing from the gist of the invention. For example, the LED chip 2 in the first embodiment or the LED chip 22 in the third embodiment may be combined with the low refractive index-member 11 in the second embodiment. This further reduces light emitted from any LED chip toward another adjacent LED chip and it is thereby possible to further reduce light loss due to light absorption between LED chips.

In addition, the invention according to claims is not to be limited to the above-mentioned embodiments. Further, it should be noted that all combinations of the features described in the embodiments are not necessary to solve the problem of the invention.

What is claimed is:

1. A light-emitting device, comprising:
   a plurality of LED chips arranged in series and each comprising a chip substrate and a crystal layer including a light-emitting layer,
   wherein one of the plurality of LED chips is configured such that the chip substrate thereof comprises a side surface facing another adjacent LED chip of the plurality of LED chips,
   wherein the side surface has a highest cleavability among all side surfaces of the chip substrate of the one of the plurality of LED chips, and
   wherein the plurality of LED chips are arranged in a line such that side surfaces of the one of the plurality of LED chips, which are located adjacent to the side surface with the highest cleavability, face sidewalls of the case.

2. The light-emitting device according to claim 1, wherein the chip substrate comprises a hexagonal crystal, and
   wherein the side surface having the highest cleavability comprises an m-plane.

3. The light-emitting device according to claim 2, wherein the chip substrate is rectangular in a plain view, and
   wherein four side surfaces of the chip substrate comprise an m-plane or an a-plane.

4. The light-emitting device according to claim 2, wherein the chip substrate comprises GaN.

5. The light-emitting device according to claim 1, wherein the chip substrate comprises a GaN based semiconductor crystal, and
   wherein the side surface having the highest cleavability comprises a c-plane.

6. The light-emitting device according to claim 5, wherein the chip substrate is rectangular in a plain view, and
   wherein four side surfaces of the chip substrate comprise a c-plane and an a-plane.

7. The light-emitting device according to claim 1, wherein the plurality of LED chips are formed by dividing a wafer so as to use a cleavability of the wafer.

8. A light-emitting device, comprising:
   a plurality of LED chips arranged in series or in an array pattern; and
   a sealing resin for sealing the plurality of LED chips,
   wherein one of the plurality of LED chips comprises a predetermined refractive index-member disposed on a first side surface thereof facing another adjacent LED chip of the plurality of LED chips,
   wherein the predetermined refractive index-member has a lower refractive index than the sealing member,
   wherein the sealing resin is disposed on a second side surface of said one of the plurality of LED chips, and
   wherein the predetermined refractive index-member is formed on each of side surfaces of the LED chips that faces an adjacent LED chip of the plurality of LED chips.

9. The light-emitting device according to claim 8, wherein the predetermined refractive index-member comprises a silicone-based resin, a fluorine-based resin, a siloxane-based resin, glass, $SiO_2$ or a mixture of two or more thereof.

10. The light-emitting device according to claim 8, wherein the second side surface of said one of the plurality of LED chips faces an outer edge of the sealing resin.

11. The light-emitting device according to claim 8, wherein, in a cross-sectional view of the light-emitting device, the second side surface of said one of the plurality of LED chips is located opposite to the first side surface of said one of the plurality of LED chips.

12. The light-emitting device according to claim 8, wherein, in a plan view of the light-emitting device, the second side surface of said one of the plurality of LED chips is located adjacent to the first side surface of said one of the plurality of LED chips.

13. The light-emitting device according to claim 8, wherein the sealing resin is disposed on a third side surface of said one of the plurality of LED chips.

14. The light-emitting device according to claim 13, wherein, in a plan view of the light-emitting device, the second side surface and the third side surface of said one of the plurality of LED chips are located adjacent to the first side surface of said one of the plurality of LED chips.

15. The light-emitting device according to claim 14, wherein the predetermined refractive index-member is disposed on a fourth side surface of said one of the plurality of LED chips.

16. The light-emitting device according to claim 15, wherein, in the plan view of the light-emitting device, the fourth side surface of said one of the plurality of LED chips is located opposite to the first side surface of said one of the plurality of LED chips.

17. The light-emitting device according to claim 1, wherein, in a side view of the light-emitting device, the side surface of said one of the plurality of LED chips faces a side surface of the adjacent LED chip, the side surface of the adjacent LED chip having highest cleavability among all side surfaces of the chip substrate of the adjacent LED chip.

18. The light-emitting device according to claim 17, wherein, in the side view of the light-emitting device, the side surface of said one of the plurality of LED chips and the side surface of the adjacent LED chip extend perpendicular to a direction of an arrangement of the plurality of LED chips arranged in series.

19. The light-emitting device according to claim 1, wherein the side surface of said one of the plurality of LED chips comprises an m-plane, and
   wherein, in a plan view of the light-emitting device, another side surface of said one of the plurality of LED chips, which is located adjacent to the side surface of said one of the plurality of LED chips, comprises an a-plane.

20. The light-emitting device according to claim 19, wherein a principle surface of the chip substrate comprises a c-plane.

* * * * *